(12) United States Patent
Kim

(10) Patent No.: US 7,696,688 B2
(45) Date of Patent: Apr. 13, 2010

(54) ORGANIC ELECTROLUMINESCENCE DISPLAY AND METHOD FOR MANUFACTURING THE SAME

(75) Inventor: Chang Nam Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/290,535

(22) Filed: Dec. 1, 2005

(65) Prior Publication Data

US 2006/0119260 A1 Jun. 8, 2006

(30) Foreign Application Priority Data

Dec. 2, 2004 (KR) .................. 10-2004-0100360

(51) Int. Cl.
*H05B 33/00* (2006.01)
*H05B 33/02* (2006.01)

(52) U.S. Cl. .................. 313/506; 313/504; 313/505; 313/498; 445/24

(58) Field of Classification Search .............. 313/506, 313/498, 483, 257; 362/84; 257/613
See application file for complete search history.

(56) References Cited

U.S. PATENT DOCUMENTS

| | | | |
|---|---|---|---|
| 5,701,055 A * | 12/1997 | Nagayama et al. .......... 313/504 |
| 5,952,037 A | 9/1999 | Nagayama et al. | |
| 6,538,374 B2 * | 3/2003 | Hosokawa .................. 313/504 |
| 7,012,366 B2 * | 3/2006 | Park et al. .................. 313/505 |
| 7,064,482 B2 * | 6/2006 | Park .......................... 313/504 |
| 7,132,796 B2 * | 11/2006 | Lee et al. .................... 313/610 |
| 7,224,115 B2 * | 5/2007 | Sato et al. ................... 313/504 |
| 2002/0036462 A1 * | 3/2002 | Hirano ....................... 313/506 |
| 2002/0158577 A1 * | 10/2002 | Shimoda et al. ............ 313/506 |
| 2003/0052869 A1 * | 3/2003 | Fujii et al. .................. 345/204 |
| 2003/0111957 A1 | 6/2003 | Kim et al. | |
| 2003/0205970 A1 * | 11/2003 | Park et al. .................. 313/506 |
| 2004/0100191 A1 * | 5/2004 | Park .......................... 313/506 |
| 2004/0195959 A1 * | 10/2004 | Park et al. .................. 313/500 |
| 2005/0116620 A1 * | 6/2005 | Kobayashi .................. 313/503 |
| 2005/0127825 A1 * | 6/2005 | Bae et al. .................... 313/504 |
| 2005/0161740 A1 * | 7/2005 | Park et al. .................. 257/347 |

FOREIGN PATENT DOCUMENTS

| | | |
|---|---|---|
| JP | 2000-012220 | 1/2000 |
| JP | 2002-082633 | 3/2002 |
| JP | 2002-208489 A | 7/2002 |
| JP | 2004-006343 | 1/2004 |
| JP | 2004-207255 | 7/2004 |
| JP | 2004-213002 | 7/2004 |
| KR | 10-2004-0007823 A | 1/2004 |

* cited by examiner

*Primary Examiner*—Sikha Roy
(74) *Attorney, Agent, or Firm*—Holland & Knight LLP

(57) ABSTRACT

An adhesive type organic EL display, and a method for manufacturing the same are disclosed. The organic EL display comprises a first substrate having a thin transistor formed thereon, and a second substrate having an organic EL element formed thereon. The organic EL display further comprises at least two partition walls formed in a non-light emitting region of the second substrate, an insulation layer formed to cover a portion of each partition wall, and a second electrode, which is formed on the partition walls, and electrically connected to the thin transistor of the first substrate.

5 Claims, 7 Drawing Sheets

ORGANIC ELECTROLUMINESCENCE DISPLAY AND METHOD FOR MANUFACTURING THE SAME

This application claims the benefit of Korean Patent Application No. 10-2004-0100360, filed on Dec. 2, 2004, which is hereby incorporated by reference as if fully set forth herein.

BACKGROUND OF THE INVENTION

1. Field of the Invention

The present invention relates to an organic electroluminescence (EL) display, and more particularly, to an adhesive type organic EL display, and a method for manufacturing the same.

2. Discussion of the Related Art

Generally, an adhesive type organic EL display comprises a lower panel having a pixel switching element and a pixel driving element formed thereon, and an upper panel having organic materials stacked thereon, in which the lower board is electrically connected with the upper board by bonding the upper and lower panels, thereby embodying the display.

A method for manufacturing a conventional adhesive type organic EL display will be described as follows.

FIG. 1 shows a cross-sectional view illustrating a conventional adhesive type organic EL display.

In FIG. 1, the display comprises a lower panel having a thin transistor formed thereon, and an upper panel having an organic EL element formed thereon.

Referring to FIG. 1, the lower panel of the organic EL display is manufactured by the following process.

First, a semiconductor layer 2 is formed using a polycrystalline silicon on a transparent substrate 1, and is removed via patterning except for a region where the thin transistor will be formed.

Next, after sequentially forming a gate insulation layer 3, and a conductive layer for a gate electrode over the entire surface of the substrate 1, the conductive layer is patterned to form a gate electrode 4.

Then, impurity ions such as phosphorus (P) are implanted to the semiconductor layer 2 using the gate electrode 4 as a mask, and then source/drain regions are formed by annealing the substrate, thereby forming an N-MOS thin transistor.

At this time, portions of the semiconductor layer 2 where the impurity ions are not implanted become channel regions.

Next, an interlayer insulation layer 5 is formed over the entire surface of the substrate comprising the above components, and the interlayer insulation layer 5 and the gate insulation layer 3 are selectively removed such that the source/drain regions of the N-MOS transistor are exposed.

Then, an electrode line 6 is formed on the substrate such that the electrode line 6 is electrically connected with the source/drain regions, respectively, thereby completing manufacture of the lower panel.

Next, referring to FIG. 1, the upper panel of the organic EL display is manufactured by the following process.

First, an anode 8 composed of a transparent conductive material having a high work function such as ITO or IZO is formed on a transparent substrate 7.

Then, an insulation layer 9 is formed on some portion of the anode 8 using an insulation material such as polyimide, and a partition wall 10 is formed on the insulation layer 9.

Next, an island-shaped spacer 11 is formed in a pixel region using another insulation material.

Then, a cathode 13 composed of a conductive material having a low work function such as aluminum is deposited on an electron implantation layer, thereby completing manufacture of the upper panel.

The upper and lower panels manufactured as described above are attached to each other.

At this time, the upper and lower panels are electrically connected by contacting the cathode 13 formed on the spacer 11 of the upper panel with the electrode line 6 of the lower panel.

However, the adhesive type organic EL display manufactured as described above has the following problems.

In general, since the spacer has a higher profile than that of the partition wall, and must be formed to have a gentle side angle, it is difficult to form the spacer.

In addition, when forming the organic material using a shadow mask, the spacer is likely to be collapsed or damaged by the shadow mask.

Furthermore, since the spacer is formed in a light emitting region, an aperture ratio is reduced.

SUMMARY OF THE INVENTION

Accordingly, the present invention is directed to a an adhesive type organic EL display, and a method for manufacturing the same that substantially obviates one or more problems due to limitations and disadvantages of the related art.

An object of the present invention is to provide an adhesive type organic EL display, which does not comprise a spacer, and a method for manufacturing the same.

Another object of the present invention is to provide an adhesive type organic EL display, and a method for manufacturing the same, which can simplify a process, enhance reliability of the product, and has a high optical efficiency.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an adhesive type organic EL display comprising a first substrate having a thin transistor formed thereon, and a second substrate having an organic EL element formed thereon, the thin transistor of the first substrate being electrically connected with the organic EL element of the second substrate further comprises: at least two partition walls formed in a non-light emitting region of the second substrate; an insulation layer formed to cover a portion of each partition wall; and a second electrode formed on the partition walls, and electrically connected to the thin transistor of the first substrate.

Each of the partition walls may have a structure of substrate/assistant electrode/first electrode or a structure of substrate/first electrode/assistant electrode stacked therebelow.

The non-light emitting region may have a structure of substrate/assistant electrode/first electrode/organic light emitting layer/second layer or a structure of substrate/first electrode/second electrode stacked between the partition walls.

The insulation layer covering the portion of one partition wall may be symmetrical to the insulation layer covering the portion of the other partition wall adjacent to the one partition wall.

In another aspect of the present invention, an organic EL display comprising a first substrate having a thin transistor formed thereon, and a second substrate having an organic EL element formed thereon, further comprises: a light emitting region, and a non-light emitting region provided to the second substrate; an assistant electrode formed on the second substrate of the non-light emitting region; a first electrode formed over an entire surface of the second substrate including the assistant electrode; at least two partition walls formed on the first electrode of the non-light emitting region; an insulation layer to cover a portion of each partition wall; a light emitting layer formed on the first electrode of the light emitting region; and a second electrode formed over the entire surface of the second substrate including the light emitting layer, and electrically connected to the thin transistor of the first substrate.

In yet another aspect of the present invention, an organic EL display comprising a first substrate having a thin transistor formed thereon, and a second substrate having an organic EL element formed thereon further comprises: a light emitting region, and a non-light emitting region provided to the second substrate; a first electrode formed on the second substrate; an assistant electrode formed on the first electrode of the non-light emitting region; partition walls formed on the assistant electrode; an insulation layer to cover a portion of each partition wall; a light emitting layer formed on the first electrode of the light emitting region; and a second electrode formed over an entire surface of the second substrate including the light emitting layer, and electrically connected to the thin transistor of the first substrate.

In another yet aspect of the present invention, a method for manufacturing an organic EL display comprises the steps of: forming an assistant electrode on a non-light emitting region of a second substrate; forming a first electrode over an entire surface of the second substrate including an upper or lower portion of the assistant electrode; forming partition walls on a region where the assistant electrode is formed; forming an insulation layer to cover a portion of each partition wall; forming a light emitting layer on the first electrode of the light emitting region; and forming a second electrode over the entire surface of the second substrate including the light emitting layer; and electrically connecting the second electrode with a thin transistor of a first substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
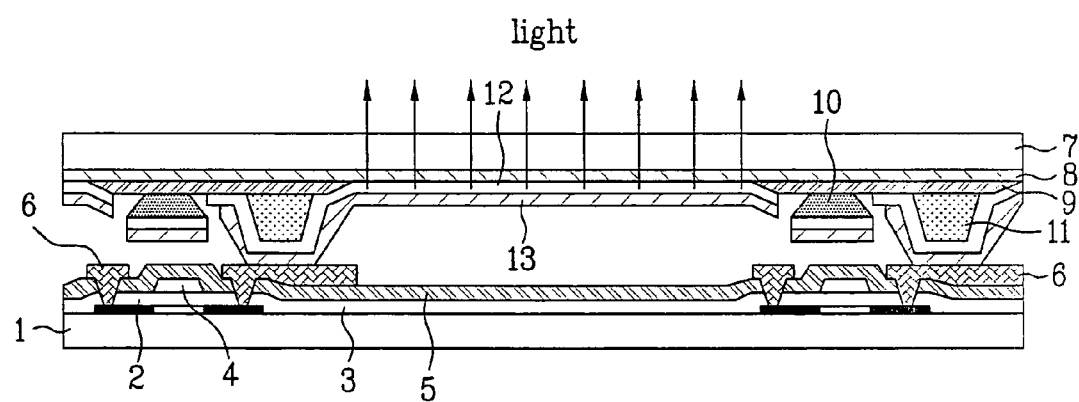
FIG. 1 is a cross-sectional view illustrating a conventional adhesive type organic EL display.
Figure 2:
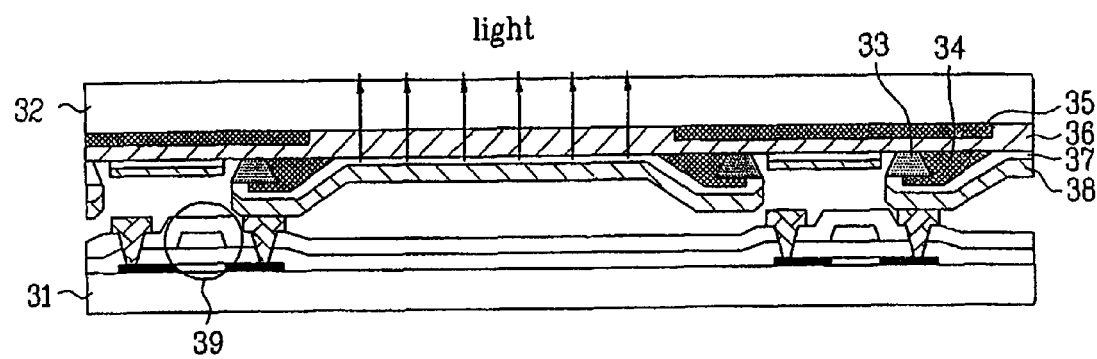
FIG. 2 is a cross-sectional view illustrating an adhesive type organic EL display in accordance with a first embodiment of the present invention.

FIG. 2 is a cross-sectional view illustrating an adhesive type organic EL display in accordance with a first embodiment of the present invention.

As shown in FIG. 2, the organic EL display of the first embodiment comprises a first substrate 31 having an a-Si thin transistor 39 formed thereon, and a second substrate 32 which has an organic EL element formed thereon, and is bonded to the first substrate 31.

An electrode of the thin transistor of the first substrate 31 is electrically connected with an electrode of the organic EL element of the second substrate 32.

The second substrate 32 has an assistant electrode 35, a first electrode 36 acting as an anode, at least two partition walls 33, an insulation layer 34, an organic light emitting layer 37, and a second electrode 38 acting as a cathode, formed thereon.

The at least two partition walls 33 are formed in a non-light emitting region of the second substrate 32, in which the first electrode 36, and the assistant electrode 35 are formed below each partition wall 33.

The insulation layer 34 is formed to cover a portion of each partition wall 33.

Here, the insulation layer 34 covering the portion of one partition wall 33 is symmetrical to the insulation layer covering the portion of the other partition wall 33 adjacent to the one partition wall 33.

In other words, the insulation layer 34 is formed on opposite sides of adjacent partition walls 33 in which the opposite sides do not face each other, and the organic light emitting layer 37 is formed between the sides of the adjacent partition walls 33 in which the sides face each other.

A method for manufacturing the organic EL display of the first embodiment will be described as follows.

FIGS. 4A to 4E are cross-sectional views for illustrating steps of the method for manufacturing an adhesive type organic EL display in accordance with the first embodiment.

Figure 4A:
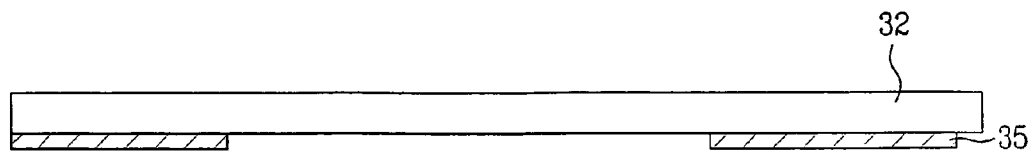
FIGS. 4A to 4E are cross-sectional views for illustrating steps of a method for manufacturing an adhesive type organic EL display in accordance with the first embodiment.

First, as shown in FIG. 4A, an assistant electrode 35 is formed on a non-light emitting region of a second substrate 32.

Here, the assistant electrode 35 is composed of a conductive material, and preferably, of Al, Mo, an AnNd alloy, Cr, Cu, and the like.

Figure 4B:
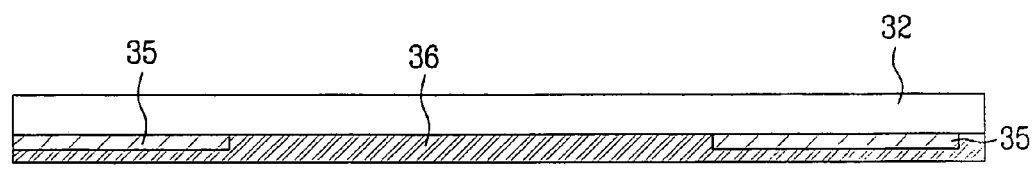

Next, as shown in FIG. 4B, a first electrode 36 is formed over the entire surface of the second substrate 32 including the assistant electrode 35.

The first electrode 36 acts as an anode, and is preferably composed of at least one of ITO and IZO.

Figure 4C:
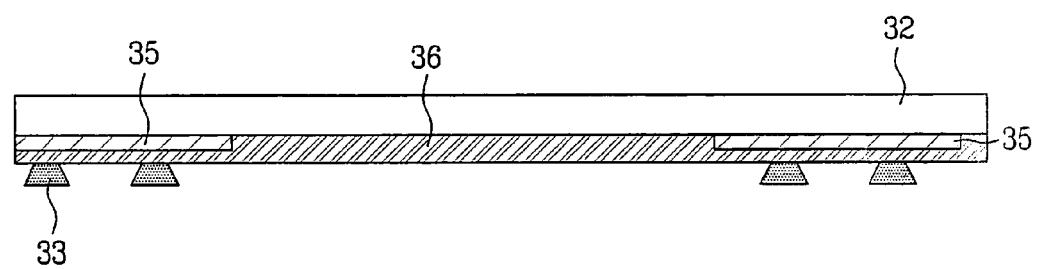

Then, as shown in FIG. 4C, at least two partition walls 33 are formed on the first electrode 36 where the assistant electrode 35 is formed.

Figure 6A:
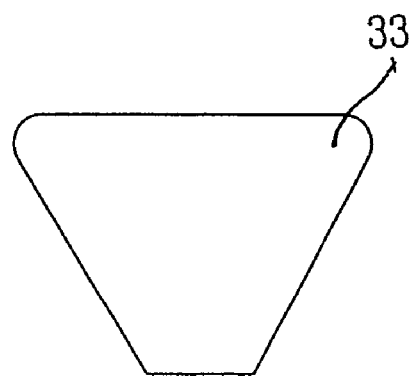
FIGS. 6A and 6B are views illustrating the shapes of partition walls of the adhesive type organic EL display in accordance with the present invention.

Here, as shown in FIG. 6A, each of the partition walls 33 preferably is a structure wherein a lower surface thereof is narrower than an upper surface thereof to be formed with the second electrode 38.

Figure 6B:
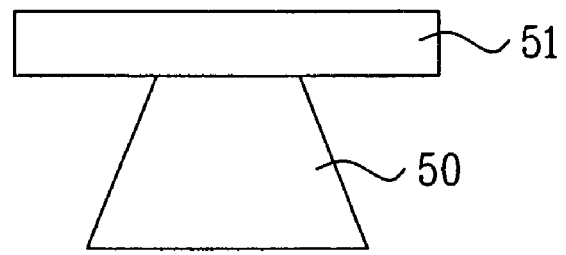

In addition, as shown in FIG. 6B, each of the partition walls 33 may comprise a first section 50, which has a lower surface thereof wider than an upper surface thereof to be formed with the second electrode 38, and a second section 51, which is formed on the upper surface of the first section 50 and wider than the lower surface of the first section 50.

Figure 4D:
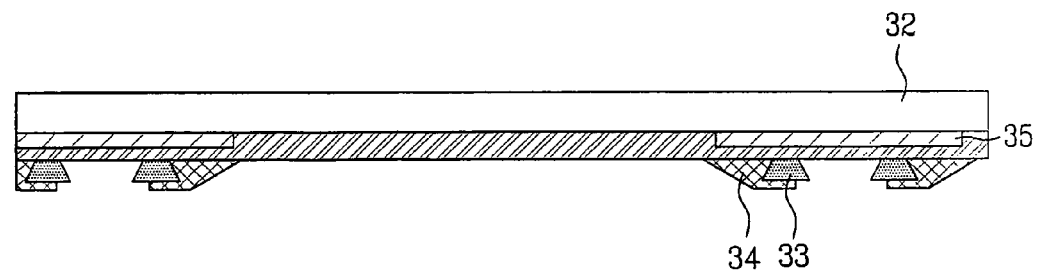

Then, as shown in FIG. 4D, an insulation layer 34 is formed to cover a portion of each partition wall 33.

Here, the insulation layer 34 is formed on opposite sides of adjacent partition walls 33 in which the opposite sides do not face each other.

The insulation layer 34 can be composed of an organic material or an inorganic material, and is preferably composed of a polymeric material.

In particular, the insulation layer 34 advantageously comprises at least one of photosensitive polyimide, polyacryl, and novolac-based organic insulation layers.

Figure 4E:
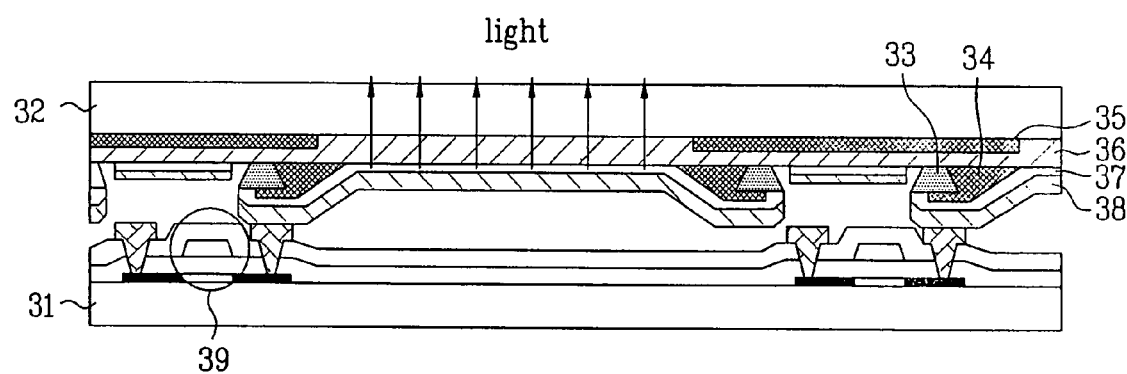

In addition, as shown in FIG. 4E, an organic light emitting layer 37 is formed on the first electrode 36 of the light emitting region, and a second electrode 38 acting as a cathode is formed over the entire surface of the second substrate 32 including the organic light emitting layer 37.

Then, the first substrate 31 having the thin transistor is attached to the second substrate 32 having the organic EL element such that the second electrode 38 is electrically connected with the thin transistor of the first substrate 31, thereby completing the manufacture of the organic EL display.

At this time, the first substrate 31 is attached to the second substrate 32 using a sealant such that the organic EL display has an internal space formed to have a vacuum by the attachment of the first and second substrates 31 and 32.

In addition, a getter is added to the internal space of the organic EL display, and serves to adsorb moisture and oxygen.

At this time, a getter made of barium with high oxidizing properties can be used.

Figure 3:
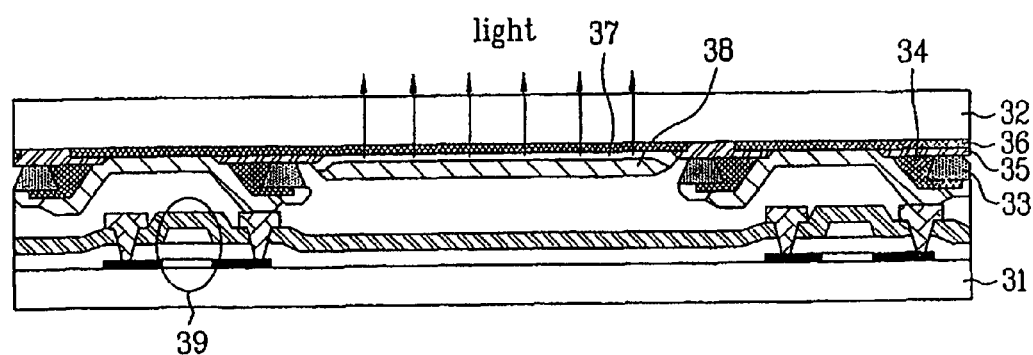
FIG. 3 is a cross-sectional view illustrating an adhesive type organic EL display in accordance with a second embodiment of the present invention.

FIG. 3 is a cross-sectional view illustrating an adhesive type organic EL display in accordance with a second embodiment of the present invention.

As shown in FIG. 3, the organic EL display of the second embodiment comprises a first substrate 31 having a p-Si thin transistor 39 formed thereon, and a second substrate 32 which has an organic EL element formed thereon, and is bonded to the first substrate 31.

An electrode of the thin transistor of the first substrate 31 is electrically connected with an electrode of the organic EL element of the second substrate 32.

The second substrate 32 has an assistant electrode 35, a first electrode 36 acting as an anode, at least two partition walls 33, an insulation film 34, an organic light emitting layer 37, and a second electrode 38 acting as a cathode, formed thereon.

The at least two partition walls 33 are formed in a non-light emitting region of the second substrate 32, in which the island-shaped assistant electrode 35, and the first electrode 36 are formed below each partition wall 33.

The insulation layer 34 is formed to cover a portion of each partition wall 33.

Here, the insulation layer 34 covering the portion of one partition wall 33 is symmetrical to the insulation layer covering the portion of the other partition wall 33 adjacent to the one partition wall 33.

In other words, the insulation layer 34 is formed on sides of adjacent partition walls 33 in which the sides face each other, and the organic light emitting layer 37 is not formed between the adjacent partition walls 33.

A method for manufacturing the organic EL display of the second embodiment will be described as follows.

FIGS. 5A to 5D are cross-sectional views for illustrating steps of the method for manufacturing the adhesive type organic EL display in accordance with the first embodiment.

Figure 5A:
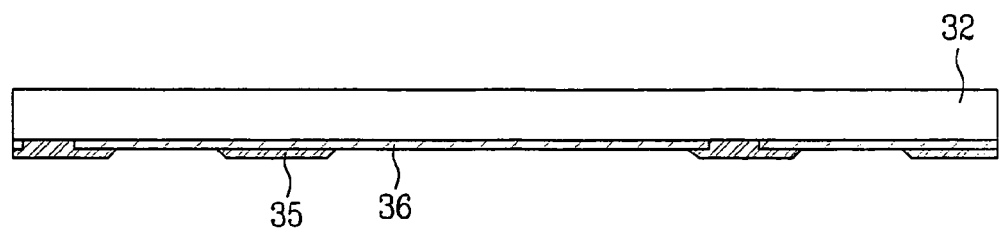
FIGS. 5A to 5D are cross-sectional views for illustrating steps of a method for manufacturing an adhesive type organic EL display in accordance with the second embodiment.

First, as shown in FIG. 5A, a first electrode 36 is formed on a second substrate 32, and an island-shaped assistant electrode 35 is formed on a non-light emitting region of the first electrode 36.

Here, the assistant electrode 35 can be composed of a conductive material, and is preferably composed of Al, Mo, an AnNd alloy, Cr, Cu, and the like.

In addition, the first electrode 36 acts as an anode, and is preferably composed of ITO or IZO.

Figure 5B:
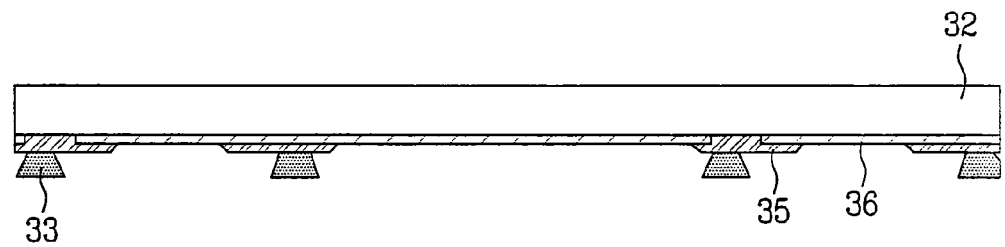

Then, as shown in FIG. 5B, partition walls 33 are formed on the assistant electrode 35.

Figure 5C:
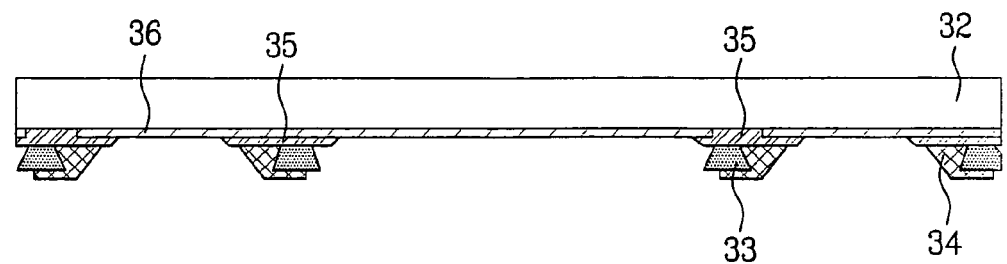

Next, as shown in FIG. 5C, an insulation layer 34 is formed to cover a portion of each partition wall 33.

Here, the insulation layer 34 is formed on sides of adjacent partition walls 33, which face each other.

Figure 5D:
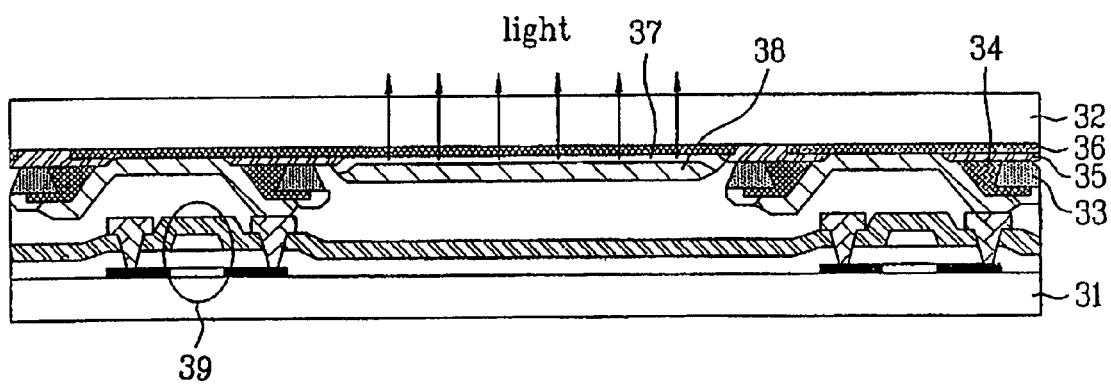

In addition, as shown in FIG. 5D, an organic light emitting layer 37 is formed on the first electrode 36 of the light emitting region, and a second electrode 38 acting as a cathode is formed over the entire surface of the second substrate 32 including the organic light emitting layer 37.

Then, the first substrate 31 having the thin transistor is attached to the second substrate 32 having the organic EL element such that the second electrode 38 is electrically connected with the thin transistor of the first substrate 31, thereby completing the manufacture of the organic EL display.

As is apparent from the above description, according to the present invention, since the organic EL display does not employ a spacer, it is possible to secure an aperture ratio, simplify the manufacturing process, enhance the reliability of the product, and improve optical efficiency.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescent(EL) display, comprising:
   a first substrate having a thin film transistor;
   a second substrate having a light emitting region and a non-light emitting region;
   an assistant electrode formed on the non-light emitting region of the second substrate;
   a first electrode formed on the second substrate;
   a plurality of partition walls formed on the first electrode in the non-light emitting region;
   an insulation layer to cover a portion of each partition wall;
   a light emitting layer formed on the first electrode of the light emitting region; and
   a second electrode formed on the light emitting layer, wherein the second electrode formed over the insulation layer is electrically and directly connected to the thin film transistor of the first substrate;

wherein the insulation layer is formed between the first electrode and the light emitting layer and between the partition walls and the light emitting layer so that the insulation layer is formed on a portion of an upper surface of each partition wall that faces the first substrate and on a portion of a side surface of each partition wall, and wherein the plurality of partition walls comprises a first section having a lower surface thereof wider than an upper surface thereof to be formed with the second electrode, and a second section being formed on the upper surface of the first section, and wider than the lower surface of the first section.

2. The organic EL display according to claim 1, wherein the assistant electrode comprises at least one of Al, Mo, an AnNd alloy, Cr and Cu.

3. The organic EL display according to claim 1, wherein the first electrode comprises an anode, and the second electrode comprises a cathode.

4. An organic electroluminescent(EL) display, comprising:
   a first substrate having a thin film transistor;
   a second substrate having a light emitting region and a non-light emitting region;
   a first electrode formed on the second substrate;
   an assistant electrode formed on the first electrode in the non-light emitting region of the second substrate;
   a plurality of partition walls formed on the assistant electrode;
   an insulation layer to cover a portion of each partition wall;
   a light emitting layer formed on the first electrode of the light emitting region of the second substrate; and
   a second electrode formed on the light emitting layer and on the insulation layer, wherein the second electrode formed on the insulation layer is electrically and directly connected to the thin film transistor of the first substrate;
   wherein the insulation layer is formed between the second electrode and the assistant electrode and between the partition walls and the assistant electrode so that the insulation layer is formed on a portion of an upper surface of each partition wall that faces the first substrate and on a portion of a side surface of each partition wall, and
   wherein the plurality of partition walls comprises a first section having a lower surface thereof wider than an upper surface thereof to be formed with the second electrode, and a second section being formed on the upper surface of the first section, and wider than the lower surface of the first section.

5. A method for manufacturing an organic electroluminescent(EL) display comprising a first substrate having a thin film transistor formed thereon, and a second substrate having an organic EL element formed thereon, the method comprising:
   forming an assistant electrode on a non-light emitting region of the second substrate;
   forming a first electrode over an entire surface of the second substrate including an upper portion or lower portion of the assistant electrode in the non-light emitting region of the second substrate;
   forming partition walls on a region where the assistant electrode is formed;
   forming an insulation layer to cover a portion of each partition wall;
   forming a light emitting layer on the first electrode of the light emitting region;
   forming a second electrode over the entire surface of the second substrate including the light emitting layer; and
   attaching the first substrate and the second substrate so as to electrically and directly connect the second electrode with the thin film transistor of the first substrate;
   wherein the insulation layer is formed between the first electrode and the light emitting layer and between the partition walls and the light emitting layer so that the insulation layer is formed on a portion of an upper surface of each partition wall that faces the first substrate and on a portion of a side surface of each partition wall, and
   wherein the plurality of partition walls comprises a first section having a lower surface thereof wider than an upper surface thereof to be formed with the second electrode, and a second section being formed on the upper surface of the first section, and wider than the lower surface of the first section.

* * * * *